United States Patent
Nepal et al.

(10) Patent No.: US 11,443,942 B2
(45) Date of Patent: *Sep. 13, 2022

(54) PLASMA-ASSISTED ATOMIC LAYER EPITAXY OF CUBIC AND HEXAGONAL INN FILMS AND ITS ALLOYS WITH AIN AT LOW TEMPERATURES

(71) Applicant: The Government of the United States of America, as represented by the Secretary of the Navy, Arlington, VA (US)

(72) Inventors: Neeraj Nepal, Woodbridge, VA (US); Charles R. Eddy, Jr., Columbia, MD (US); Nadeemullah A. Mahadik, Springfield, VA (US); Syed B. Qadri, Fairfax Station, VA (US); Michael J. Mehl, Davidsonville, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,344

(22) Filed: Sep. 7, 2017

(65) Prior Publication Data

US 2018/0040472 A1  Feb. 8, 2018

Related U.S. Application Data

(63) Continuation of application No. 13/916,724, filed on Jun. 13, 2013, now Pat. No. 9,773,666.

(Continued)

(51) Int. Cl.
*H01L 21/02* (2006.01)
*H01L 29/20* (2006.01)
(Continued)

(52) U.S. Cl.
CPC ...... *H01L 21/0254* (2013.01); *H01L 21/0242* (2013.01); *H01L 21/0262* (2013.01);
(Continued)

(58) Field of Classification Search
CPC ....... C30B 25/02; C30B 25/205; C30B 29/38; C30B 29/40; C30B 29/403;
(Continued)

(56) References Cited

U.S. PATENT DOCUMENTS

| 2010/0038656 A1* | 2/2010 | Zimmerman | ....... H01L 31/0547 257/88 |
| 2010/0065855 A1* | 3/2010 | Yokoyama | ............ H01L 33/007 257/76 |

(Continued)

OTHER PUBLICATIONS

Vahak Marghussian, Nano-Glass Ceramics, Processing, Properties and Applications, 2015, pp. 1-62 (Year: 2015).*
Cryst. Growth Des. 2013, 13, 1485-1490.

*Primary Examiner* — Hua Qi
(74) *Attorney, Agent, or Firm* — US Naval Research Laboratory; Roy Roberts

(57) ABSTRACT

Described herein is a method for growing indium nitride (InN) materials by growing hexagonal and/or cubic InN using a pulsed growth method at a temperature lower than 300° C. Also described is a material comprising InN in a face-centered cubic lattice crystalline structure having an NaCl type phase.

19 Claims, 4 Drawing Sheets

Related U.S. Application Data

(60) Provisional application No. 61/661,016, filed on Jun. 18, 2012.

(51) Int. Cl.
   *C30B 25/02* (2006.01)
   *C30B 25/20* (2006.01)
   *C30B 29/38* (2006.01)
   *C30B 29/40* (2006.01)

(52) U.S. Cl.
   CPC .. H01L 21/02381 (2013.01); H01L 21/02433 (2013.01); H01L 21/02458 (2013.01); H01L 21/02661 (2013.01); H01L 29/2003 (2013.01); *C30B 25/02* (2013.01); *C30B 25/205* (2013.01); *C30B 29/38* (2013.01); *C30B 29/40* (2013.01); *C30B 29/403* (2013.01)

(58) Field of Classification Search
   CPC ........... H01L 21/02381; H01L 21/0242; H01L 21/02433; H01L 21/02458; H01L 21/0254; H01L 21/0262; H01L 21/02661; H01L 29/2003
   See application file for complete search history.

(56) References Cited

U.S. PATENT DOCUMENTS

| | | | |
|---|---|---|---|
| 2011/0108887 A1* | 5/2011 | Fareed | H01L 29/7787 257/194 |
| 2012/0052681 A1* | 3/2012 | Marsh | C23C 16/0227 438/680 |

* cited by examiner

PLASMA-ASSISTED ATOMIC LAYER EPITAXY OF CUBIC AND HEXAGONAL INN FILMS AND ITS ALLOYS WITH AIN AT LOW TEMPERATURES

CROSS-REFERENCE TO RELATED APPLICATIONS

This application is a continuation of U.S. patent application Ser. No. 13/916,724 filed on Jun. 13, 2013 which in turns claims the benefit of U.S. Provisional Application 61/661,016 filed on Jun. 18, 2012, each of which is incorporated herein by reference.

BACKGROUND

Among III-nitride semiconductors, indium nitride (InN) has the smallest direct band gap, largest electron saturation velocity and mobility, and smallest electron effective mass. It has long been an attractive semiconductor material for application in optical, electrical, and optoelectronic device technologies such as solar-cells and high electron mobility and high frequency devices. The most thermodynamically stable phase of the InN is a wurtzite structure (a hexagonal phase), however, the growth of zincblende (a cubic phase) InN on InAs/GaAs has been demonstrated at 450° C. by plasma assisted molecular beam epitaxy (MBE). Cubic InN has a smaller band gap and superior electronic properties as its lattice is isotropic and possesses lower phonon scattering.

BRIEF SUMMARY

In one embodiment, a method for growing indium nitride (InN) materials, comprises growing hexagonal and/or cubic InN using a pulsed growth method at a temperature lower than 300° C. The InN can consist of a homogenous phase of either hexagonal or cubic InN.

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used herein, "low temperature" means temperatures lower than 300° C., and if otherwise specified can refer to yet lower temperatures such as lower than 280° C., lower than 260° C., lower than 240° C., lower than 220° C., lower than 200° C., lower than 180° C., and so on.

Indium precursors include trimethylindium (TMI) and others known in the art.

Aluminum precursor includes trimethylaluminum (TMA) and others known in the art.

As used in this specification and the appended claims, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

DESCRIPTION

InN layers were simultaneously grown using a Cambridge Nano Tech (CNT) Fiji 200 atomic layer deposition/epitaxy (ALE) system on a-plane sapphire, semi-insulating Si(111), and GaN/sapphire templates. Sapphire substrates were used to ensure unambiguous characterization of the electrical transport properties of the ALE InN layers on an insulator. Wafers were solvent cleaned and rinsed with deionized (DI) water before any further surface pretreatments. Si(111), GaN/sapphire, and sapphire surfaces were pretreated with HF, HF and 15% HCl, and solvents, respectively. The growth was carried out in an ultrahigh purity (UHP) argon (Ar) ambient. After ex situ surface pretreatment, substrates were treated with the 50 sccm N$_2$ plasma at 300 watts before InN growth. About 150 to 1100 cycles of ALE deposition (see below) were used to synthesize InN films on different substrates simultaneously. The values of parameters given in this paragraph are examples, with other values possible.

Figure 1:
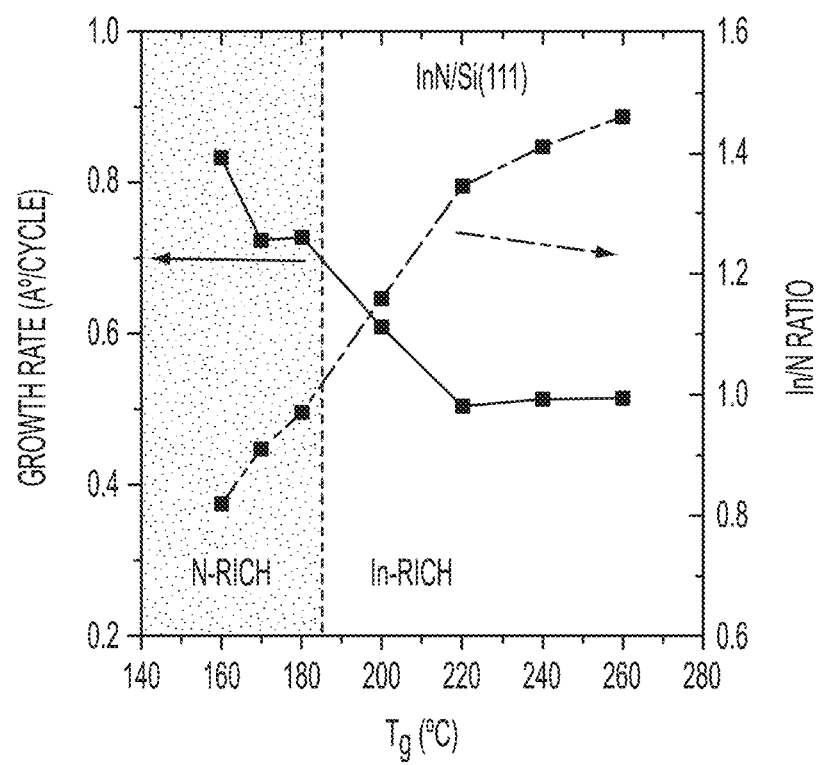
FIG. 1 shows variation of growth rate (GR) and In/N ratio with a trimethylindium (TMI) pulse of 0.06 seconds.

FIG. 1 shows variation of growth rate (GR) and In/N ratio with a trimethylindium (TMI) pulse of 0.06 seconds. The GR was decreased from 0.83 to 0.73 Å with increasing temperature from 160 to 183° C. It remains constant for a small temperature window and decreases again to 0.51 Å at 220° C. For T$_g$ between 220-260° C., the GR remains constant. The temperature range between 220-260° C. is the second atomic layer epitaxy (ALE) window. In the first low temperature ALE window the InN growth is N-rich (In/N<1) and it is In-rich (In/N>1) for the high temperature ALE window. An In/N ratio of 2.8±0.7 has been measured on MBE grown InN (see Piper et al., J. Vac. Sci. Technol. A 23, 617 (2005)). Thus, the ALE InN has better stoichiometry.

Figure 2:
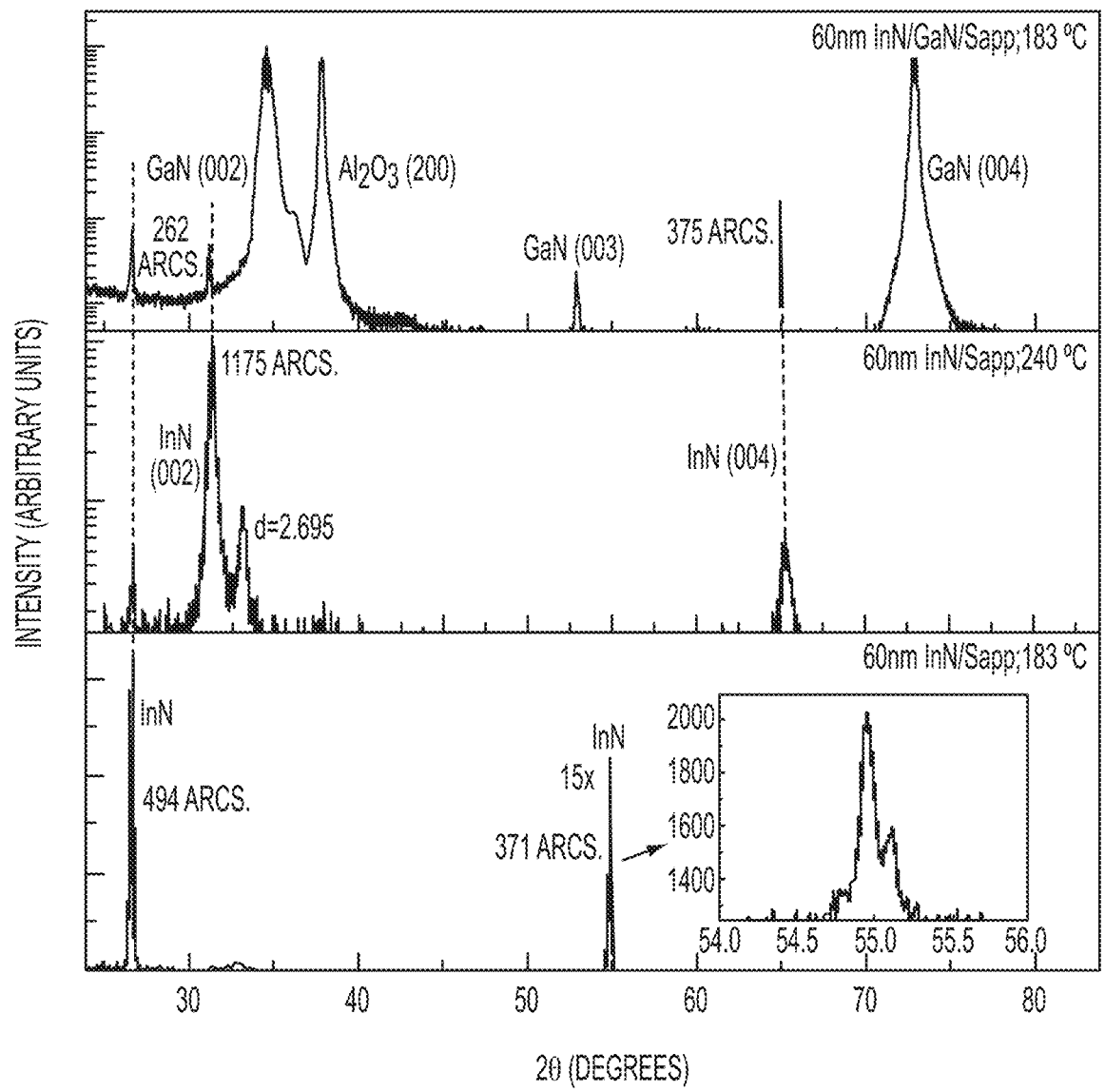
FIG. 2 depicts the x-ray diffraction (XRD) peaks from three of the samples—namely InN (60 nm) on GaN/Al$_2$O$_3$ template with T$_g$=183° C. (top) and on a-plane Al$_2$O$_3$ with T$_g$=240° C. (middle) and 183° C. (bottom)).

FIG. 2 depicts the XRD peaks from three of the samples—namely InN (60 nm) on GaN/Al$_2$O$_3$ template with T$_g$=183° C. (top) and on a-plane Al$_2$O$_3$ with T$_g$=240° C. (middle) and 183° C. (bottom)). The top plot indicates the material has a hexagonal phase. In the bottom plot, there are a set of peaks that could be indexed to either a face centered cubic (FCC) structure with the (200) and (400) indices, or a CsCl structure with (110) and (220) indices. Also measured were the 24 hr long Laue diffraction (LD) patterns on this sample in transmission as well as grazing incidence reflection mode. In both modes Laue spots were observed, indicating that this sample has an epitaxial nature and not a powder/polycrystalline nature. This is also confirmed with the second order peak in the bottom plot which has resolved in the $K\alpha_1$ and $K\alpha_2$ components (inset). This peak is obtained via a 15 summation scan to enhance the signal. The FWHM values are 494 and 371 arc-secs for the first and second order peaks, respectively. The first order peak is a convolution of the two $K\alpha$ components. In order to confirm the structure, the third order peak was examined, which was not measurable since it occurs at much higher angles and the sample is only 60 nm thick. Also, the d-spacings of the first two peaks do not match to any InN phases in the ICDD database. The results suggest that the InN on a sapphire at 183° C. has a highly oriented epitaxial structure. Further analysis of the data reveals that the d spacings (6.68 Å) of the first peak do not match to any of the known InN phases in the reported international center for diffraction data (ICDD) database and instead corresponds to a face centered cubic (FCC) structure which has not been reported before. The XRD data was corroborated by electron microscopy as described in *Cryst. Growth Des.* 2013, 13, 1485-1490, incorporated herein by reference.

Figure 3:
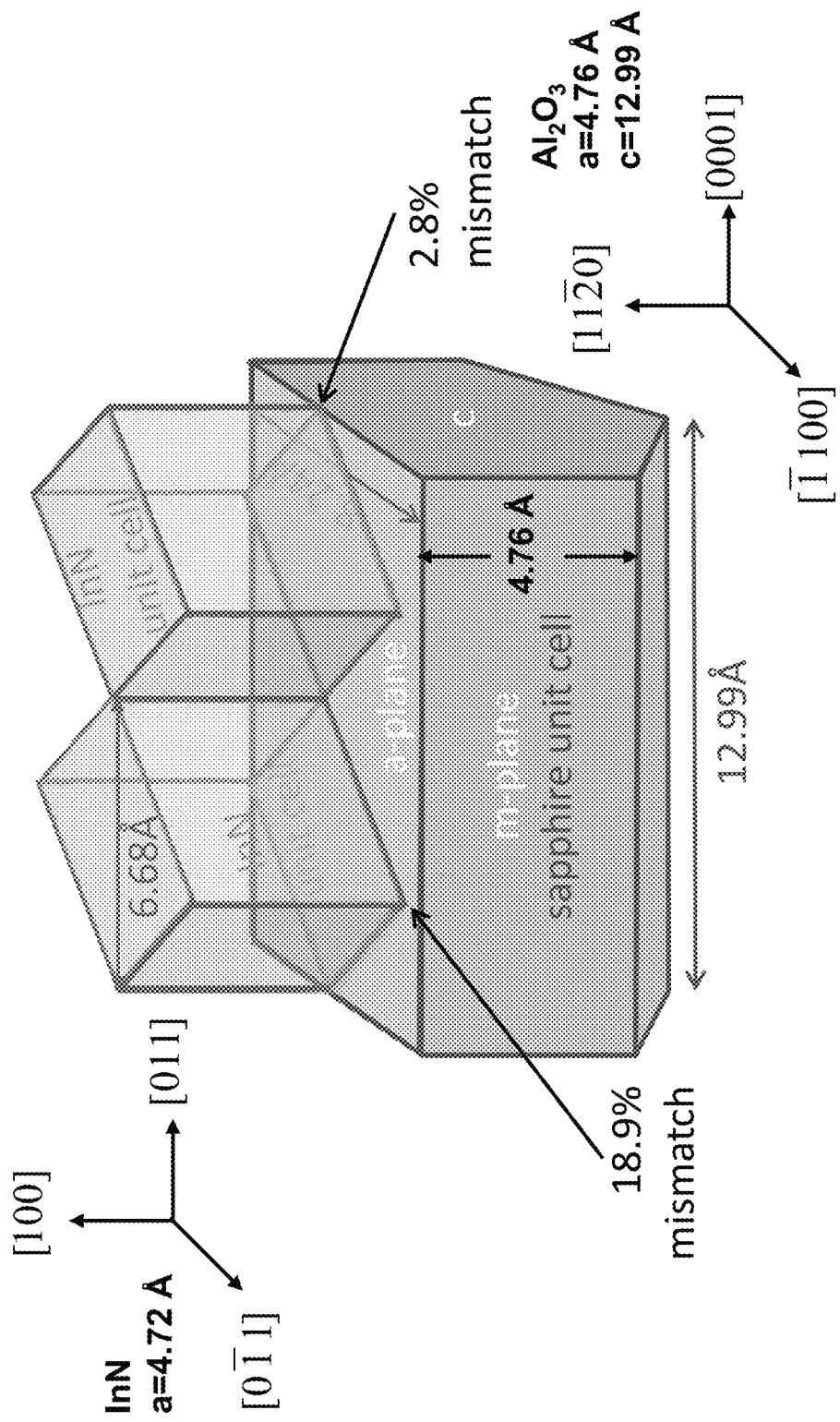
FIG. 3 shows a schematic of the possible structure of a face centered cubic (fcc) InN phase and how it would align to an a-plane sapphire unit cell.
Figure 4:
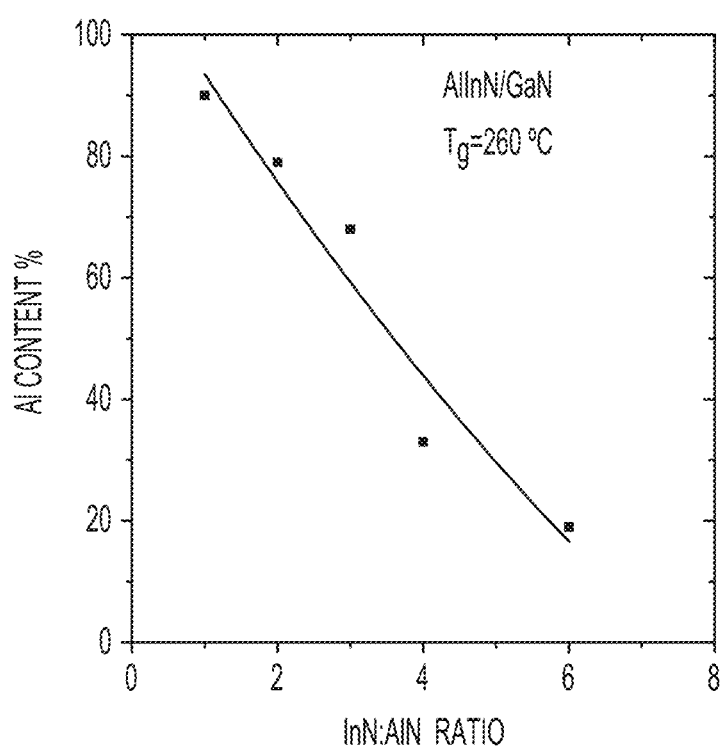
FIG. 4 depicts the variation of Al content in Al$_x$In$_{1-x}$N with the AlN/InN cycles ratios in the whole range of x as determined by x-ray photoelectron spectroscopy. AlN and InN layers were grown as described. First the InN was grown on GaN and then the AlN. Number of layers of InN and AlN were varied to get required concentration of Al content.

FIG. 3 shows a schematic of the alignment of a face centered cubic (fcc) InN phase unit cell with an a-plane sapphire substrate unit cell. From the measured lattice parameter of the InN film assuming the FCC structure, we see that it has only a 2.8% mismatch with the in-plane c-direction and a 18.9% mismatch with the in-plane m-direction of sapphire. This is further indication that this is the most likely phase of the grown InN film on a-plane sapphire.

There has been a previous report (see ref. 21) of cubic InN growth at 450° C. by plasma-assisted molecular beam epitaxy (MBE) on InAs/GaAs, but the InN is demonstrated to have a ZnS (zincblende) phase rather than a NaCl-type phase as obtained herein.

Table 1 summarizes different parameters and their values to synthesize various materials. Each ALE cycle consisted of first a 60 ms trimethylindium (TMI) pulse (which was empirically found as self-limited ALE growth mode, with longer pulses not providing significantly greater growth), which were added to a constant 30 and 100 sccm flow of UHP argon carrier gas. After each TMI pulse, the main pumping valve was closed for 5 sec so that the surface would saturate with In atoms. A 20 second long 300 watt $N_2$ plasma exposure was used to provide nitrogen precursor to the indium saturated surface. To remove unreacted precursors, the deposition chamber was purged with UHP argon for 10 s after each pulse. The reactor chuck was heated resistively, and the temperature was calibrated using thermocouple and by pyrometer by CNT. The values of parameters given are examples. Other values are possible.

For the ALE growth of AlInN, InN and AlN layers were grown layer by layer in the fashion of a digital alloy. To grow $Al_{0.90}In_{0.10}N$, AlN and InN were grown alternatively. For an AlN for every two cycles of InN results $Al_{0.79}In_{0.21}N$. For an AlN for every three cycles of InN results $Al_{0.68}In_{0.32}N$. Thus by changing the combination of number layers of InN and AlN, $Al_xIn_{1-x}N$ films can be obtained in for a wide range of x via atomic layer epitaxy. In this manner, AlInN ternary alloys are realized over the entire desired stoichiometry range—this is believed to be the first time this was accomplished. The values of parameters given are examples. Other values are possible.

TABLE 1 growth parameters for ALE of InN

| Parameters | TMI Pulse | Purge | 300 W $N_2$ Plasma | Plasma pulse | Purge | Number of cycl |
|---|---|---|---|---|---|---|
| Studied range | 0.015-0.1 sec | 5-15 sec | 50-150 sccm | 10-30 sec | 5-15 sec | 150-1100 |
| Established value | 0.06 sec | 10 sec | 100 sccm | 20 sec | 10 sec | — |

TABLE II growth parameters for ALE of AlN

| Parameters | TMA Pulse | Purge | 300 W $N_2/H_2$ Plasma | Plasma pulse | Purge |
|---|---|---|---|---|---|
| Studied range | 0.03-0.1 sec | 5-40 sec | $N_2$ only-$N_2$:$H_2$ = 1:3 | 10-30 sec | 5-40 sec |
| Established value | 0.06 sec | 10 sec | 42/8 sccm | 20 sec | 10 sec |

The techniques described herein are expected to provide a crystalline material having low oxygen impurity by ex situ and in situ surface treatment. Moreover, in situ surface treatment with the atomic hydrogen, nitrogen, mixture of hydrogen and nitrogen, and/or ammonia plasma is possible. It is possible to vary purge time with the pumping speed in order to control carbon impurities.

Concluding Remarks

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

REFERENCES

Each of the following is incorporated herein by reference, particularly for the teaching for which it was cited.
1. Y. Nanishi, Y. Saito, and T. Yamaguchi, Jpn. J. Appl. Phys. 42, 2549 (2003) and the references therein.
2. A. G. Bhuiyan, A. Hashimoto, and A. Yamamoto, J. Appl. Phys. 94, 2779 (2003).

3. N. Dietz, M. Alevli, V. Woods, M. Strassburg, H. Kang, and I. T. Ferguson, Phys. Status Solidi B 242, 2985 (2005).
4. R. P. Bhatta, B. D. Thoms, A. Weerasekera, A. G. U. Perera, M. Alevli, and N. Dietz, J. Vac. Sci. Technol. 25, 967 (2007).
5. Shou-Yi Kuo, Fang-I Lai, Wei-Chun Chen, Woei-Tyng Lin, Chien-Nan Hsiao, Hsin-I Lin, and Han-Chang Pan, Diamond & Related Materials 20, 1188 (2011).
6. M. A. Hafez and H. E. Elsayed-Ali, J. Vac. Sci. Technol. A 27, 696 (2009).
7. K. S. Boutros, F. G. McIntosh, J. C. Roberts, S. M. Bedair, E. L. Piner, and N. A. El-Masry. Appl. Phys. Lett. 67, 1856 (1995).
8. C. Ozgit, I. Donmez, M. Alevli, and N. Biyikli, J. Vac. Sci. Technol. A 30, 01A124 (2012).
9. N. H. Karam, T. Parodos, P. Colter, D. McNulty, W. Rowland, J. Schetzina, N. El-Masry, and S. M. Bedair, Appl. Phys. Lett. 67, 94 (1995).
10. K. Kim, N. Kwak, and S. Lee, Electron. Mater. Lett. 5, 83 (2009).
11. M. Alevli, C. Ozgit, I. Donmez, and N. Biyikli, Phys. Status Solidi A 209, 266 (2012).
12. O. Ambacher, M. S. Brandt, R. Dimitrov, T. Metzger, M. Stutzmann, R. A. Fischer, A. Miehr, A. Bergmaier, and G. Dollinger, J. Vac. Sci. Technol. B 14, 3532 (1996). InN dissociation temp 630
13. M. Y. Duan, L He, M. Xu, M. Y. Xu, Shuyan Xu, and K. Ostrikov, Phys. Rev. B 81, 033102 (2010).
14. A. Yamamoto, T. Shin-ya, T. Sugiura, A. Hashimoto, J. Cryst. Growth, 189/190, 461 (1998).
15. J. G. Lozano, F. M. Morales, R. Garcia, D. Gonzalez, V. Lebedev, Ch. Y. Wang, V. Cimalla, and O Ambacher, Appl. Phys. Lett. 90, 091901 (2007).
16. A. Janotti and C, G. Van de Walle, Appl. Phys. Lett. 92, 032104 (2008).
17. L. F. J. Piper, T. D. Veal, M. Walker, I. Mahboob, C. F. McConville, H. Lu, and W. J. Schaff, J. Vac. Sci. Technol. A 23, 617 (2005)
18. C. G. Van de Walle, J. L. Lyons, and A. Janotti, Solidi A 207, 1024 (2010).
19. T. Matsuoka, H. Okamoto, M. Nakao, H. Harima, and E. Kurimoto, Appl. Phys. Lett. 81, 1246 (2002).
20. M. C. Lee, H. C. Lin, Y. C. Pan, C. K. Shu, J. Ou, W. H. Chen, and W. K. Chen, Appl. Phys. Lett. 73, 2606 (1998).
21. A. P. Lima, A. Tabata, J. R. Leite, S. Kaiser, D. Schikora, B. Schottker, T. Frey, D. J. As, and K. Lischka, J. Cryst. Growth, 201/202, 396 (1999).

What is claimed is:

1. A method for growing crystalline, epitaxial indium nitride (InN) material, the method comprising:
providing an a-plane $Al_2O_3$ template and growing cubic InN thereon using pulsed growth plasma-assisted atomic layer epitaxy at a temperature lower than 300° C.,
wherein the obtained cubic InN has the same crystal structure throughout.

2. The method of claim 1, using $N_2$ plasma as a nitrogen precursor.

3. The method of claim 1, using trimethylindium as an indium precursor.

4. The method of claim 1, wherein said cubic InN consists of a homogenous phase of cubic InN.

5. The method of claim 1, wherein said temperature is intentionally varied during said growing in order to control conductivity of said cubic InN.

6. The method of claim 1, further comprising in situ surface treatment with atomic hydrogen, nitrogen, a mixture of hydrogen and nitrogen, and/or ammonia plasma.

7. The method of claim 1, further comprising variation of purge time with pumping speed, thereby controlling formation of carbon impurities.

8. The method of claim 1, wherein said temperature is lower than 200° C.

9. The method of claim 8, using $N_2$ plasma as a nitrogen precursor.

10. The method of claim 8, wherein said cubic InN consists of a homogenous phase of cubic InN.

11. The method of claim 8, wherein said temperature is intentionally varied during said growing in order to control conductivity of said cubic InN.

12. The method of claim 8, further comprising in situ surface treatment with atomic hydrogen, nitrogen, a mixture of hydrogen and nitrogen, and/or ammonia plasma.

13. The method of claim 8, further comprising variation of purge time with pumping speed, thereby controlling formation of carbon impurities.

14. The method of claim 1, wherein said pulsed growth method comprises pulsed growth of an $Al_xIn_{1-x}N$ film at a temperature lower than 300° C. by via alternate pulses of indium or aluminum precursor and nitrogen precursor, such that x is a number greater than 0 and less than 1.

15. The method of claim 14, using $N_2$ plasma and/or ammonia plasma as said nitrogen precursor.

16. The method of claim 14, wherein said film has a homogenous phase.

17. The method of claim 14, further comprising in situ surface treatment with atomic hydrogen, nitrogen, a mixture of hydrogen and nitrogen, and/or ammonia plasma.

18. The method of claim 14, further comprising variation of purge time with pumping speed, thereby controlling formation of carbon impurities.

19. The method of claim 14, further comprising the use of a trimethylaluminum as an aluminum precursor.

* * * * *